United States Patent
Nakagawa

(10) Patent No.: US 10,692,282 B2
(45) Date of Patent: Jun. 23, 2020

(54) MODELING APPARATUS AND MODELING METHOD

(71) Applicant: FUJITSU LIMITED, Kawasaki-shi, Kanagawa (JP)

(72) Inventor: Machiko Nakagawa, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/507,038

(22) Filed: Jul. 10, 2019

(65) Prior Publication Data

US 2019/0333271 A1 Oct. 31, 2019

Related U.S. Application Data

(63) Continuation of application No. PCT/JP2017/001549, filed on Jan. 18, 2017.

(51) Int. Cl.
*G06F 30/23* (2020.01)
*G06T 17/20* (2006.01)

(52) U.S. Cl.
CPC ............ *G06T 17/205* (2013.01); *G06F 30/23* (2020.01); *G06T 2210/41* (2013.01)

(58) Field of Classification Search
CPC .............................. G06F 30/23; G06T 17/205
See application file for complete search history.

(56) References Cited

U.S. PATENT DOCUMENTS

| | | |
|---|---|---|
| 5,377,118 A | 12/1994 | Leon et al. |
| 2001/0013866 A1* | 8/2001 | Migdal .................. G06T 17/20 345/423 |
| 2001/0056308 A1* | 12/2001 | Petrov ..................... G06T 17/20 700/98 |

(Continued)

FOREIGN PATENT DOCUMENTS

| | | |
|---|---|---|
| EP | 1113400 A2 | 7/2001 |
| JP | 6-52271 A | 2/1994 |

(Continued)

OTHER PUBLICATIONS

International Search Report and Written Opinion dated Mar. 21, 2017 for PCT/JP2017/001549 filed on Jan. 18, 2017, 11 pages including English Translation of the International Search Report and Written Opinion.
Garland et al., "Surface Simplification Using Quadric Error Metrics", Carnegie Mellon University, Proceedings of the 24th annual conference on Computer graphics and interactive techniques, Aug. 3-8, 1997, pp. 209-216.
Office Action dated Apr. 21, 2020 for corresponding Japanese Patent Application No. 2018-562782, with English Translation, 6 pages.

*Primary Examiner* — Jitesh Patel

(74) *Attorney, Agent, or Firm* — Xsensus LLP

(57) ABSTRACT

A modeling apparatus calculates, with respect to edges in a three-dimensional mesh model, an evaluation value of each edge on the basis of the length of the edge, and selects the edges one by one as a first edge in ascending order of their evaluation value. In this connection, a lower evaluation value is calculated for a shorter edge. Then, if there is a specific node placement position where a value of a calculation formula using distances between the node placement position and each first face having either one of first nodes at both ends of the selected first edge as a vertex is lower than or equal to a threshold, the modeling apparatus removes the first edge, first nodes, and first faces from the three-dimensional mesh model, and adds a second node at the specific node placement position in the three-dimensional mesh model.

8 Claims, 15 Drawing Sheets

(56) References Cited

U.S. PATENT DOCUMENTS

| | | |
|---|---|---|
| 2002/0003539 A1 | 1/2002 | Abe |
| 2005/0099420 A1* | 5/2005 | Hoppe .................... G06T 17/20 345/420 |
| 2005/0219237 A1 | 10/2005 | Doi |
| 2006/0050073 A1 | 3/2006 | Kanai et al. |
| 2011/0050691 A1 | 3/2011 | Hamedi et al. |
| 2013/0300741 A1* | 11/2013 | Schmidt .................. G06T 17/20 345/420 |

FOREIGN PATENT DOCUMENTS

| | | |
|---|---|---|
| JP | 2001-184528 A | 7/2001 |
| JP | 2003-323637 A | 11/2003 |
| JP | 2006-72490 A | 3/2006 |
| WO | 2009/096891 A1 | 8/2009 |

* cited by examiner

111 THREE-DIMENSIONAL MESH MODEL

111a VERTEX INFORMATION

| Vertex(vID) | | |
|---|---|---|
| double | x,y,z | VERTEX COORDINATES |
| vector<int> | edgeID | IDENTIFIERS OF EDGES THAT SHARE VERTEX |
| double[4][4] | K | QEM COEFFICIENT |
| double | weight | WEIGHT OF NODE |

111b EDGE INFORMATION

| edge(edgeID) | | |
|---|---|---|
| int | prev_vID | IDENTIFIER OF VERTEX THAT IS START POINT OF EDGE |
| int | next_vID | IDENTIFIER OF VERTEX THAT IS END POINT OF EDGE |
| vector<int> | faceID | IDENTIFIERS OF FACES THAT SHARE EDGE |

111c FACE INFORMATION

| face(faceID) | | |
|---|---|---|
| double | vID1,vID2,vID3 | IDENTIFIERS OF VERTICES THAT FORM TRIANGLE |

111d OBJECT INFORMATION

| object(objectID) | | |
|---|---|---|
| vector<vertex> | vID1,vID2,... | COLLECTION OF VERTICES |
| vector<edge> | edgeID1,edgeID2,... | COLLECTION OF EDGES |
| vector<face> | faceID1,faceID2,... | COLLECTION OF FACES |

FIG. 7

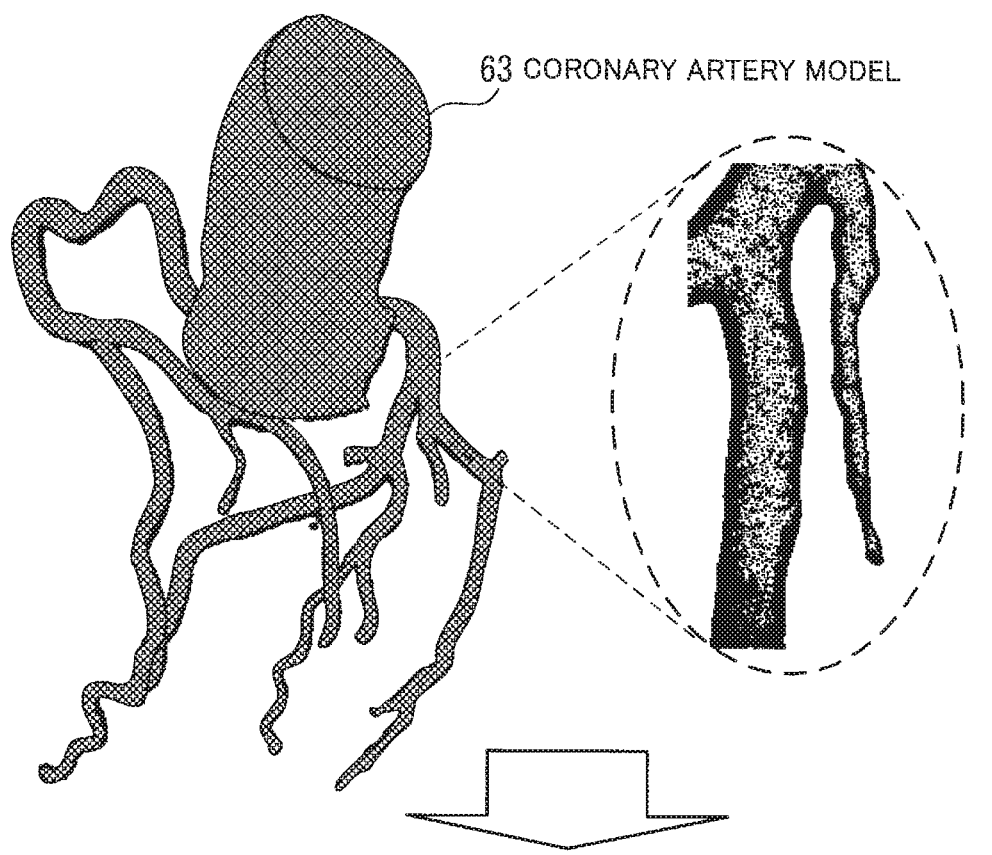
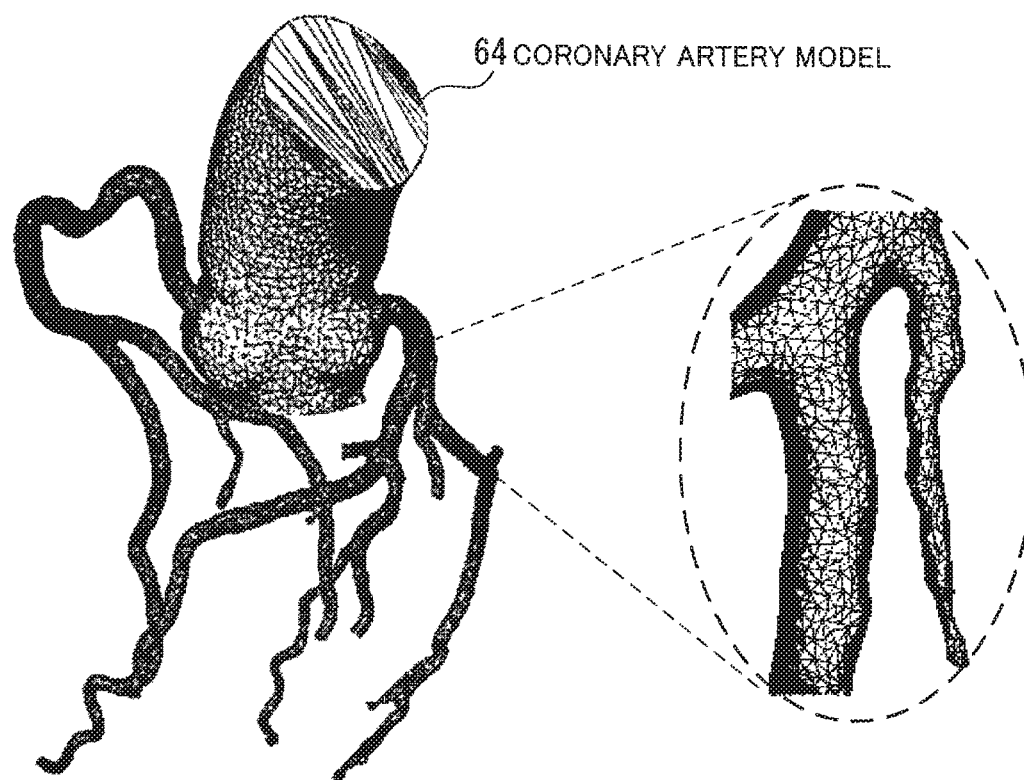
FIG. 15

MODELING APPARATUS AND MODELING METHOD

CROSS-REFERENCE TO RELATED APPLICATION

This application is a continuation application of International Application PCT/JP2017/001549 filed on Jan. 18, 2017 which designated the U.S., the entire contents of which are incorporated herein by reference.

FIELD

The embodiments discussed herein relate to a modeling apparatus and a modeling method.

BACKGROUND

Various studies have been conducted for simulating biomechanical phenomena, bioelectric phenomena, and others using numerical simulation analysis. For example, what is important for a heart to beat normally is that blood containing sufficient oxygen and substances that turn into energy is supplied to myocardium. Numerical simulation analysis enables predicting hemodynamics as to how much of blood ejected from the left ventricle each coronary artery surrounding a heart supplies to the myocardium. Such predictions support diagnosis to confirm whether sufficient blood is supplied to the myocardium of a patient suffering from stenosis of a blood vessel. At present, a blood flow in a blood vessel is measured by inserting a catheter into a body. Therefore, an alternative based on non-invasive simulation is expected.

A coronary artery model, which is one of inputs for a patient-specific coronary artery simulation, is represented by triangular faces (hereinafter, referred to as meshes), which form the shapes of aorta and coronary arteries, and tetrahedral volume elements. Elements of each part are given a different material number. A computer that creates a coronary artery model first extracts a cardiovascular area from a medical image. The computer then creates the shape of a heart and boundary surfaces with meshes, which are triangular faces, by reference to the extracted cardiovascular area, and generates volume elements on the basis of these.

Each individual has a different cardiovascular shape. Therefore, for example, a computer that creates a coronary artery model extracts the cardiovascular shape of a patient from medical images captured with a computed tomography (CT), magnetic resonance imaging (MRI), or another. Then, the computer creates a coronary artery model using triangular meshes by reference to the extracted area. In this connection, if meshes are large for a shape to be modeled, the coronary artery model may have a rough shape even though it actually has a smooth shape. In addition, two parts that are actually disconnected from each other may happen to connect to each other in the coronary artery model. To deal with these, the following technique is often employed: Sufficiently small meshes are first used to create a coronary artery model, and then the number of meshes is reduced according to the shape of the coronary artery model.

For example, a method for reducing the number of meshes is to sequentially select, on the basis of data on an isosurface of created triangles, the triangular meshes in ascending order of size, and then according to a preset reduction rate, remove the selected triangular mesh while confirming using the original three-dimensional data if the removal of the selected triangular mesh does not cause a big problem. In addition, there is another method that is to make two adjacent nodes overlap each other to merge them into one node. This method is called edge collapse (or edge contraction) since the new node is generated by collapsing one edge and combining its both end nodes.

See, for example, the following documents:
Japanese Laid-open Patent Publication No. 2003-323637; and M. Garland and P. S. Heckbert, "Surface Simplification Using Quadric Error Metrics," SIGGRAPH '97 Proceedings of the 24th annual conference on Computer graphics and interactive techniques, ACM Press, New York, 3-8 Aug. 1997, pp. 209-216.

In reducing the number of meshes with the edge collapse, a method of determining coordinates for a new node to be generated by collapsing an edge takes an important role. For example, consider the case where the coordinates of a middle point between two nodes connected by an edge is set as new coordinates. In this case, as the mesh reduction progresses, the coordinates of a point that more deviate from the original shape are set as the new coordinates, which results in losing the original shape. The above document, "Surface Simplification Using Quadric Error Metrics" by M. Garland and P. S. Heckbert, employs a technique of minimizing, with respect to each node, the sum of squares of distances (quadric error metric (QEM)) between the node and its adjacent planes including the node, in order to keep the original shape as much as possible. However, this technique collapses edges in ascending order of change in QEM to be caused by collapse, and therefore long narrow meshes are likely to be generated for a long thin shape like a coronary artery. Thus, large meshes (that are long on one side) are generated at an early stage. If the mesh reduction is further performed on such long narrow meshes, the shape becomes greatly different from the original shape. This problem occurs not only in the case of reducing the number of meshes in a coronary artery model to be used in a heart simulation but also in the case of reducing the number of meshes in a three-dimensional mesh model.

SUMMARY

According to one aspect, there is provided a modeling apparatus including: a memory configured to store therein a three-dimensional mesh model representing a three-dimensional shape with a plurality of nodes, a plurality of edges each connecting two nodes among the plurality of nodes, and a plurality of faces each with three or more nodes among the plurality of nodes as vertices; and a processor configured to perform a process including calculating, based on a length of each of the plurality of edges, an evaluation value of the edge in such a way that the evaluation value is decreased with a decrease in the length, selecting the plurality of edges one by one as a first edge in ascending order of evaluation value, and removing, upon detecting a specific node placement position where a value of a calculation formula using distances between the specific node placement position and first faces each including at least either one of first nodes at both ends of the selected first edge as a vertex is lower than or equal to a threshold, the first edge, the first nodes, and the first faces from the three-dimensional mesh model, and adding a second node at the specific node placement position, second edges each including the second node at one end thereof, and second faces each including the second node as a vertex to the three-dimensional mesh model.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWING

FIG. 7 illustrates an example of a data structure of a three-dimensional mesh model;

FIG. 15 illustrates an example of mesh reduction in a three-dimensional mesh model having portions of different thickness.

DESCRIPTION OF EMBODIMENTS

Hereinafter, preferred embodiments will be described below with reference to the accompanying drawings. It is noted that some of the embodiments may be combined as long as the combined embodiments are not mutually exclusive.

First Embodiment

A first embodiment will now be described.

Figure 1:
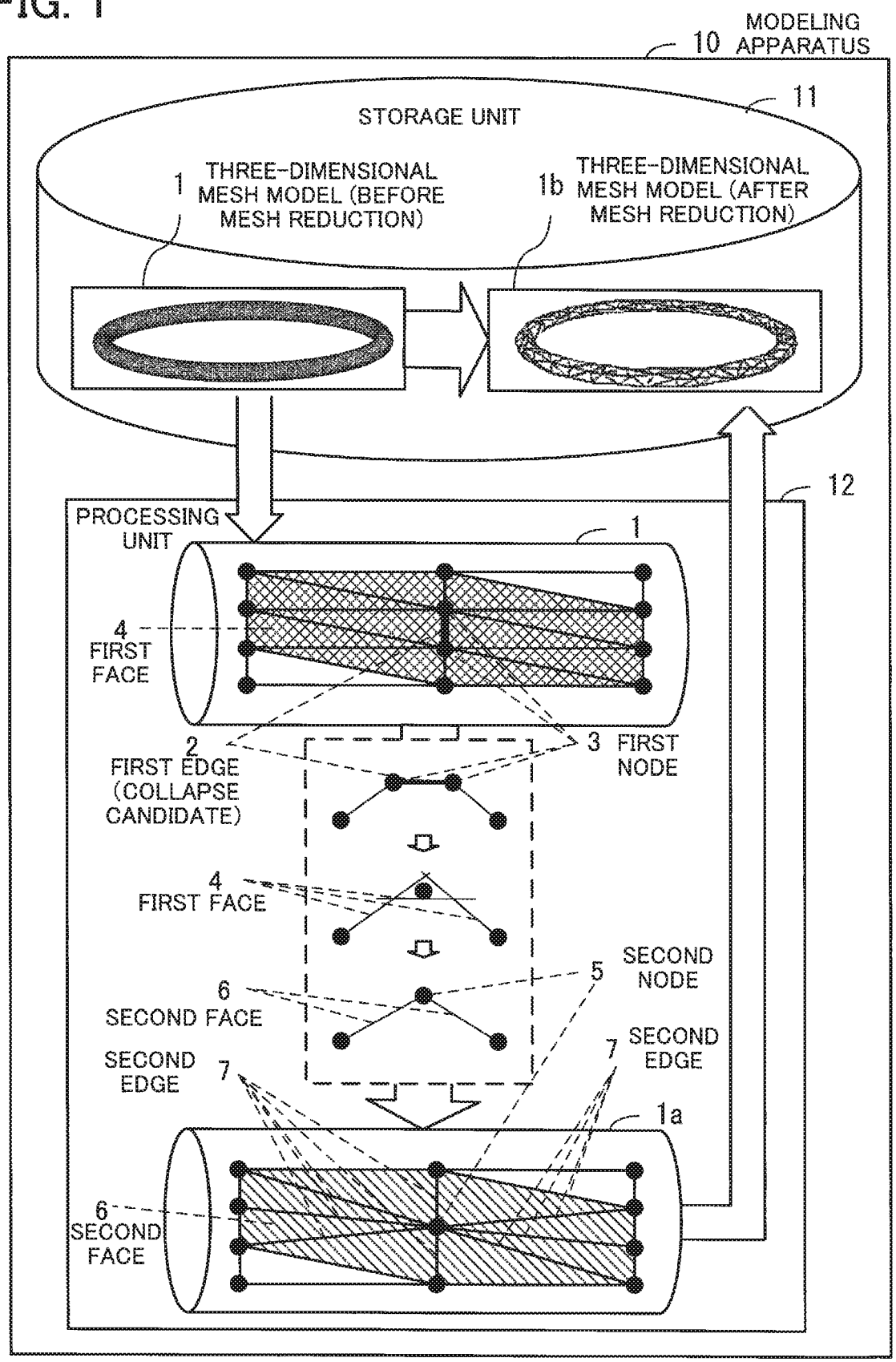
FIG. 1 illustrates an example of a configuration of a modeling apparatus according to a first embodiment.

FIG. 1 illustrates an example of a configuration of a modeling apparatus according to the first embodiment. The modeling apparatus 10 of the first embodiment includes a storage unit 11 and a processing unit 12. The storage unit 11 is a memory or storage device provided in the modeling apparatus 10, for example. The processing unit 12 is a processor or a computational circuit provided in the modeling apparatus 10, for example.

The storage unit 11 stores therein a three-dimensional mesh model 1, which represents a three-dimensional shape with a plurality of nodes, a plurality of edges each connecting two nodes, and a plurality of faces (meshes) each with three or more nodes as vertices. For example, the three-dimensional mesh model 1 represents a long thin shape.

The processing unit 12 reduces the number of meshes (the number of faces) in the three-dimensional mesh model 1 by collapsing edges. In reducing the number of meshes, the processing unit 12 first calculates an evaluation value of each edge of the three-dimensional mesh model 1 on the basis of the length of the edge. In this connection, a lower evaluation value is calculated for a shorter edge.

Next, the processing unit 12 selects the plurality of edges one by one as a first edge 2 in ascending order of their evaluation value. The first edge 2 is treated as a collapse candidate edge. The processing unit 12 performs the following process each time the first edge 2 is selected.

The processing unit 12 specifies faces (first faces 4) each having either one of both end nodes (first nodes 3) of the selected first edge 2. Referring to the example of FIG. 1, ten faces indicated by hatching are specified as the first faces 4. Then, the processing unit 12 determines whether there is a node placement position where the value of a calculation formula using distances between each of the first faces 4 and the node placement position is lower than or equal to a threshold. For example, the calculation formula is a distance function to calculate the sum of squared distances between each plane of the first faces 4 and the node placement position. Such a distance function may be called QEM. For example, the node placement position is a point where the distance function produces the lowest value. Then, the processing unit 12 determines whether the value (lowest value) of the distance function with respect to the node placement position is lower than or equal to the threshold.

When detecting a node placement position (specific node placement position) where the value of the calculation formula with respect to the node placement position is lower than or equal to the threshold, the processing unit 12 removes the first edge 2, first nodes 3, and first faces 4 from the three-dimensional mesh model 1. In addition, the processing unit 12 adds a second node 5 at the specific node placement position, second edges 7 having the second node 5 at their one ends, and second faces 6 each with the second node 5 as a vertex, to the three-dimensional mesh model 1. By doing so, a three-dimensional mesh model 1a where the first edge 2 has been collapsed is created, Referring to the example of FIG. 1, the ten first faces 4 are removed and the eight second faces 6 are generated by the collapse of the first edge 2. As a result, the number of faces is reduced by two.

After that, each time the processing unit 12 selects a first edge 2 as a collapse candidate, the processing unit 12 collapses the first edge 2 if the collapse is possible. By repeating this, all edges whose collapse is possible are collapsed. As a result, a three-dimensional mesh model 1b with reduced meshes is created.

In thus created three-dimensional mesh model 1b, newly added nodes are located at positions that do not greatly deviate from the original shape. In addition, since edges are collapsed in ascending order of their length, the meshes in the three-dimensional mesh model 1b are in almost equilateral triangular shape. As a result, even when the number of meshes is greatly reduced, the shape of the three-dimensional mesh model 1b after the mesh reduction does not greatly deviate from the shape of the original three-dimensional mesh model 1. That is, the above approach suppresses the deviation from the original shape, which is caused by the mesh reduction.

Note that the newly added second edges 7 may be treated as collapse candidates as well. In this case, after adding a second edge 7, the processing unit 12 calculates the evaluation value of the second edge 7 on the basis of the length of the second edge 7. The processing unit 12 then selects one of the second edge 7 and edges that are not yet selected among the plurality of edges included in the original three-dimensional mesh model 1, in ascending order of their evaluation value as a collapse candidate first edge 2. This enables collapsing more edges.

In the case of calculating an evaluation value of an edge included in a cylindrical portion of the three-dimensional mesh model 1, the length of the edge may be multiplied by a first weight based on the radius of the cylindrical portion including the edge, and the multiplication result may be used as the evaluation value of the edge. For example, with respect to nodes included in the cylindrical portion of the three-dimensional mesh model 1, the first weight is set based on the radius of the cylindrical portion in advance. In this connection, a higher first weight is e for a smaller radius. For example, the processing unit 12 multiplies the length of an edge by the average value of first weights respectively set for both end nodes of the edge, and uses the multiplication result as the evaluation value. That is to say, edges included in a thin portion are given a higher weight than edges included in a thick portion. Therefore, the evaluation value of an edge in the thin portion is higher than that of an edge in the thick portion even if these edges are the same in length. As a result, the edges in the thin portion are to be selected as collapse candidate first edges 2 at later time points than the edges in the thick portion. The later an edge is selected, the higher the possibility that the value of the distance function calculated to determine whether to collapse the edge is high. This means that the possibility that the edge remains without being collapsed becomes higher.

In addition, the processing unit 12 is able to end the edge collapse process when the number of meshes in the three-dimensional mesh model 1b has been reduced to a prescribed value. In this case, there is a higher possibility that an edge to be selected at a later time point remains without being collapsed.

By preferentially collapsing edges in thick portions so that edges in thin portions are likely to remain, it is possible to prevent a great deviation from the original shape due to collapse of too many edges in the thin portions.

In addition, in the case where a first edge 2 is included in a cylindrical portion of the three-dimensional mesh model 1, a formula of multiplying a value based on distances between first faces 4 and a node placement position by a second weight based on the radius of the cylindrical portion may be used as the above calculation formula. For example, with respect to nodes included in the cylindrical portion of the three-dimensional mesh model 1, the second weight may be set based on the radius of the cylindrical portion in advance. In this connection, a higher second weight is set for a smaller radius. The same value as the first weight may be used as the second weight.

In the case where the result of multiplying the value based on the distances by the average of the second weights of first nodes at both ends of the first edge 2 is lower than or equal to a threshold, the processing unit 12 removes the first edge, first nodes, and first faces and adds a second node, second edges, and second faces.

With the above approach, edges in thin portions are unlikely to be collapsed, thereby preventing collapse of too many edges in the thin portions.

In addition, the average of weights given to both end nodes of an edge is set as the first weight to be used for calculating the evaluation value of the edge and as the second weight to be used for determining whether to collapse a first edge. This approach makes it possible to collapse appropriate edges even in the boundary between portions having different radii. That is, with respect to an edge in the boundary between a thick portion and a thin portion in the three-dimensional mesh model 1, the average of a weight for the thick portion and a weight for the thin portion is used as the first weight or the second weight. This approach makes it possible to gradually change the mesh size in the boundary between portions having different thicknesses. As a result, it is possible to prevent an unnatural shape in the boundary in the three-dimensional mesh model 1b when the number of meshes is reduced.

Second Embodiment

A second embodiment will now be described.

The second embodiment is designed to reduce the number of meshes in a coronary artery model of a heart, which is to be used in a heart simulation.

To reduce the number of meshes in a coronary artery model, it is important to satisfy the following three requirements.

(First Requirement) To keep the original shape as much as possible in reducing the number of meshes.
(Second Requirement) To generate triangular meshes that are as close to equilateral triangles as possible.
(Third Requirement) To determine appropriate sizes of meshes according to the thicknesses of blood vessels.

The first requirement is important in order to carry out a heart simulation with high accuracy. If the shape of a coronary artery model after mesh reduction is greatly different from the original shape, it is to not possible to carry out a heart simulation with high accuracy.

The second requirement is also important in order to carry out a heart simulation with high accuracy. During the heart simulation, a heart model deforms along with heart beating, and the coronary artery model deforms accordingly. If each mesh is long and narrow, the coronary artery model does not deform smoothly, which deteriorates the accuracy of the heart simulation.

The third requirement is important in order to reduce the amount of computation in a heart simulation sufficiently. A coronary artery may have a peripheral or narrow portion of 1 mm or smaller in diameter, whereas the aorta is 3 cm in diameter. An increase in mesh size for a thin blood vessel area loses the smoothness of the shape. On the other hand, if small meshes are used for representing a thick blood vessel like the aorta, the heart simulation needs a large amount of computation. By setting the sizes of triangles according to blood vessels, it becomes possible to reduce more meshes without losing the smoothness of the shape.

Figure 2:
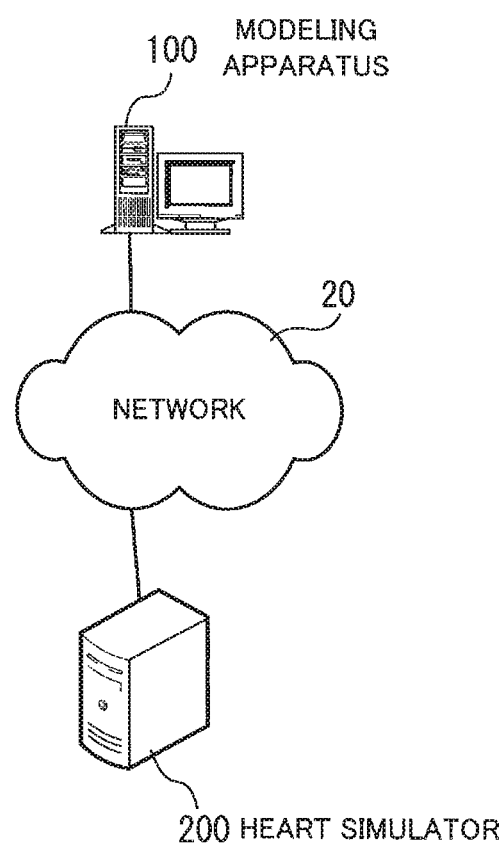
FIG. 2 illustrates an example of a configuration of a system according to a second embodiment.

FIG. 2 illustrates an example of a configuration of a system according to the second embodiment. The modeling apparatus 100 is connected to a heart simulator 200 over a network 20. The modeling apparatus 100 creates a three-dimensional model of a heart, and sends the three-dimensional model to the heart simulator 200. The heart simulator 200 carries out a coronary circulation simulation of the heart on the basis of the three-dimensional model of the heart, for example.

Figure 3:
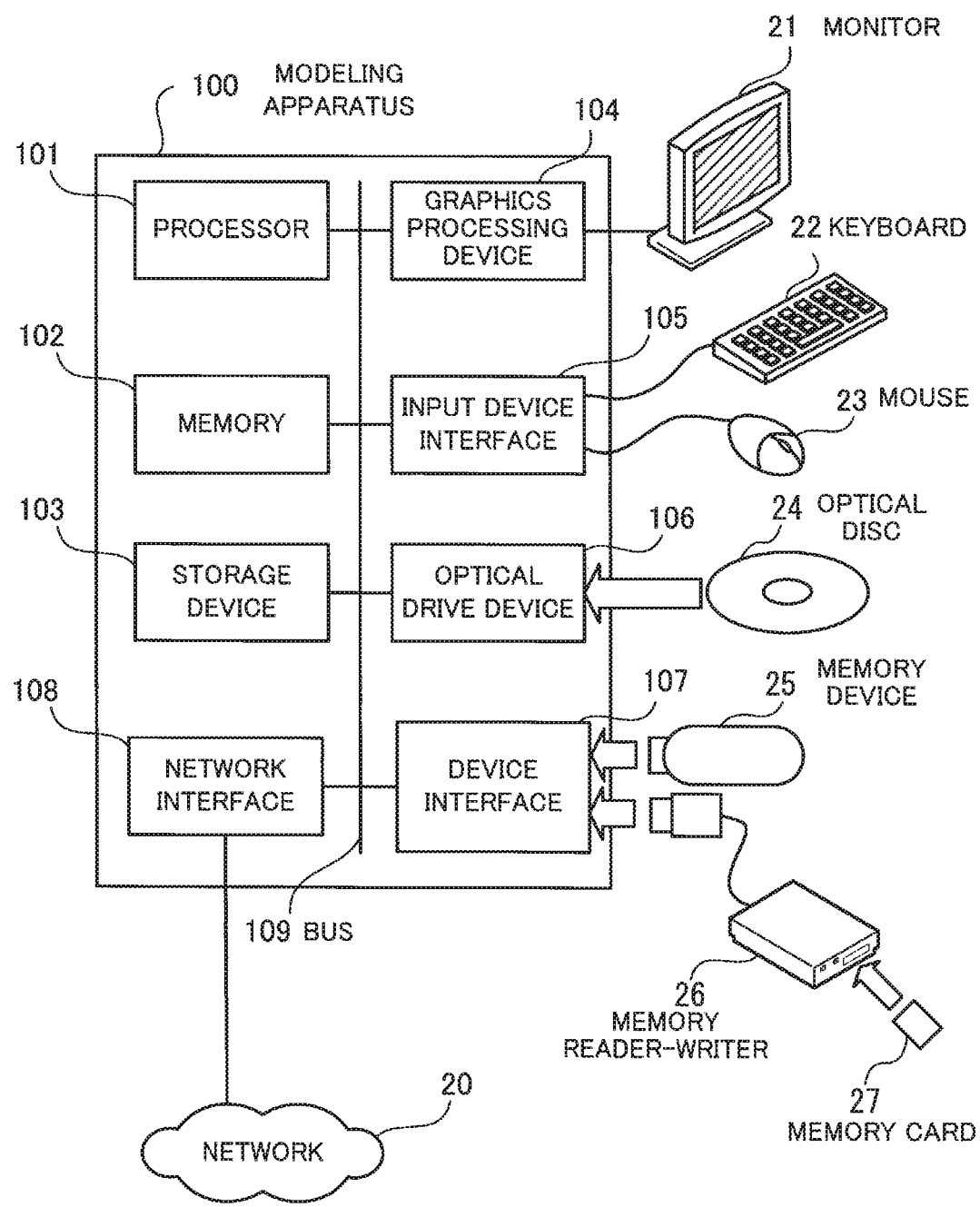
FIG. 3 illustrates an example of a hardware configuration of a modeling apparatus.

FIG. 3 illustrates an example of a hardware configuration of the modeling apparatus. The modeling apparatus 100 is entirely controlled by a processor 101. A memory 102 and a plurality of peripherals are connected to the processor 101 via a bus 109. The processor 101 may be a multiprocessor, The processor 101 is, for example, a central processing unit (CPU), a micro processing unit (MPU), or a digital signal processor (DSP). At least part of functions implemented by the processor 101 executing programs may be implemented by using an application-specific integrated circuit (ASIC), a programmable logic device (PLD), or other electronic circuits.

The memory 102 is used as a main storage device of the modeling apparatus 100. The memory 102 temporarily stores therein at least part of operating system (OS) programs and application programs to be executed by the processor 101. Also, the memory 102 stores therein a variety of data that is used by the processor 101 in processing. As the memory 102, a random access memory (RAM) or another volatile semiconductor storage device may be used, for example.

The peripherals connected to the bus 109 include a storage device 103, a graphics processing device 104, an input device interface 105, an optical drive device 106, a device interface 107, and a network interface 108.

The storage device 103 electrically or magnetically reads and writes data on a built-in recording medium. The storage device 103 is used as an auxiliary storage device of the modeling apparatus 100. The storage device 103 stores herein OS programs, application programs, and a variety of data. In this connection, as the storage device 103, a hard disk drive (HDD) or a solid state drive (SSD) may be used.

A monitor 21 is connected to the graphics processing device 104. The graphics processing device 104 displays images on the display of the monitor 21 in accordance with instructions from the processor 101. As the monitor 21, a display device using a cathode ray tube (CRT) or a liquid crystal display device may be used.

A keyboard 22 and a mouse 23 are connected to the input device interface 105. The input device interface 105 outputs signals received from the keyboard 22 and mouse 23 to the processor 101. In this connection, the mouse 23 is one example of pointing devices, and another pointing device may be used. Other pointing devices include touch panels, tablets, touch pads, and trackballs.

The optical drive device 106 reads data from an optical disc 24 with laser light or the like. The optical disc 24 is a portable recording medium on which data is recorded such as to be readable with reflection of light. The optical disc 24 may be a digital versatile disc (DVD), DVD-RAM, compact disc-read only memory (CD-ROM), compact disc-recordable (CD-R), compact disc-rewritable (CD-RW), or another.

The device interface 107 is a communication interface that allows peripherals to be connected to the modeling apparatus 100. For example, a memory device 25 and a memory reader-writer 26 may be connected to the device interface 107. The memory device 25 is a recording medium having a function of communicating with the device interface 107. The memory reader-writer 26 reads or writes data on a memory card 27, which is a card-type recording medium.

The network interface 108 is connected to the network 20. The network interface 108 communicates data with another computer or communication device over the network 20.

With the above hardware configuration, the processing functions of the second embodiment is implemented. In this connection, the modeling apparatus 10 of the first embodiment may have the same hardware configuration as the modeling apparatus 100 illustrated in FIG. 3.

The modeling apparatus 100 implements the processing functions of the second embodiment by executing programs recorded on a computer-readable recording medium, for example. The programs describing the processing content to be executed by the modeling apparatus 100 may be recorded on a variety of recording media. For example, the programs to be executed by the modeling apparatus 100 may be stored on the storage device 103. The processor 101 loads at least part of the programs from the storage device 103 to the memory 102 and then executes the programs. Alternatively, the programs to be executed by the modeling apparatus 100 may be recorded on the optical disc 24, memory device 25, memory card 27, or another portable recording medium. The programs stored in such a portable recording medium become executable after being installed on the storage device 103 under the control of the processor 101, for example. Alternatively, the processor 101 may execute the programs while directly reading them from a portable recording medium.

Figure 4:
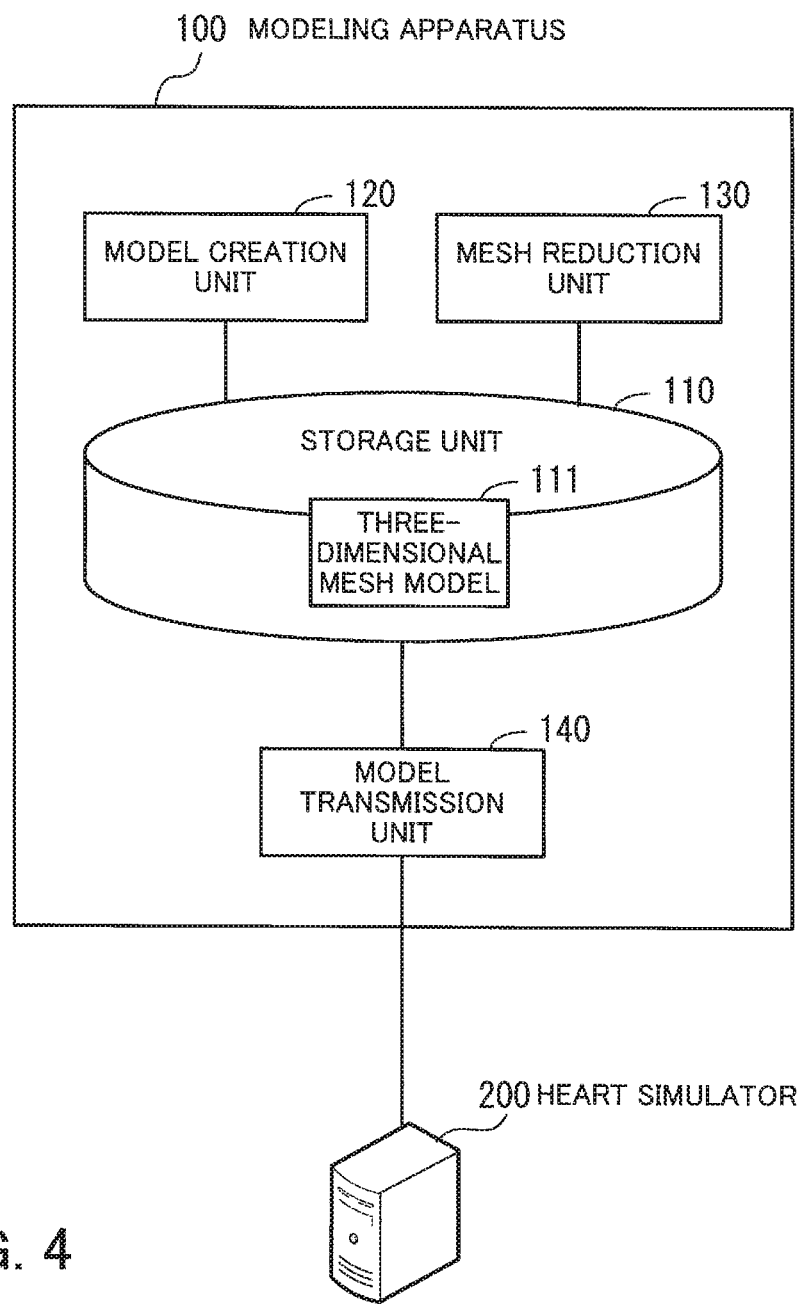
FIG. 4 is a block diagram illustrating functions of the modeling apparatus.

FIG. 4 is a block diagram illustrating functions of the modeling apparatus. The modeling apparatus 100 includes a storage unit 110, a model creation unit 120, a mesh reduction unit 130, and a model transmission unit 140.

The storage unit 110 stores therein a three-dimensional mesh model 111 of a heart. The three-dimensional mesh model 111 includes a structure mesh model, which represents the shape of the heart, and a coronary artery model.

The model creation unit 120 creates the three-dimensional mesh model 111 using fine meshes. For example, the model creation unit 120 extracts a cardiovascular shape of a patient from medical images of the patient captured with a CT, MRI, or another. Then, the model creation unit 120 creates a coronary artery model using triangular meshes on the basis of the extracted cardiovascular area.

The mesh reduction unit 130 reduces the number of meshes in the coronary artery model such as to satisfy the above-described three requirements. For example, the mesh reduction unit 130 sets a flag indicating invalidity in information about meshes to be removed among the meshes in the three-dimensional mesh model 111. In addition, when meshes are merged into a new mesh to reduce the number of meshes, the mesh reduction unit 130 adds the new mesh to the three-dimensional mesh model 111.

The model transmission unit 140 sends the three-dimensional mesh model 111 with reduced meshes to the heart simulator 200.

In this connection, functions of each unit illustrated in FIG. 4 may be implemented by a computer executing a program module corresponding to the unit, for example.

The following describes a specific structure of a coronary artery model.

Figure 5:
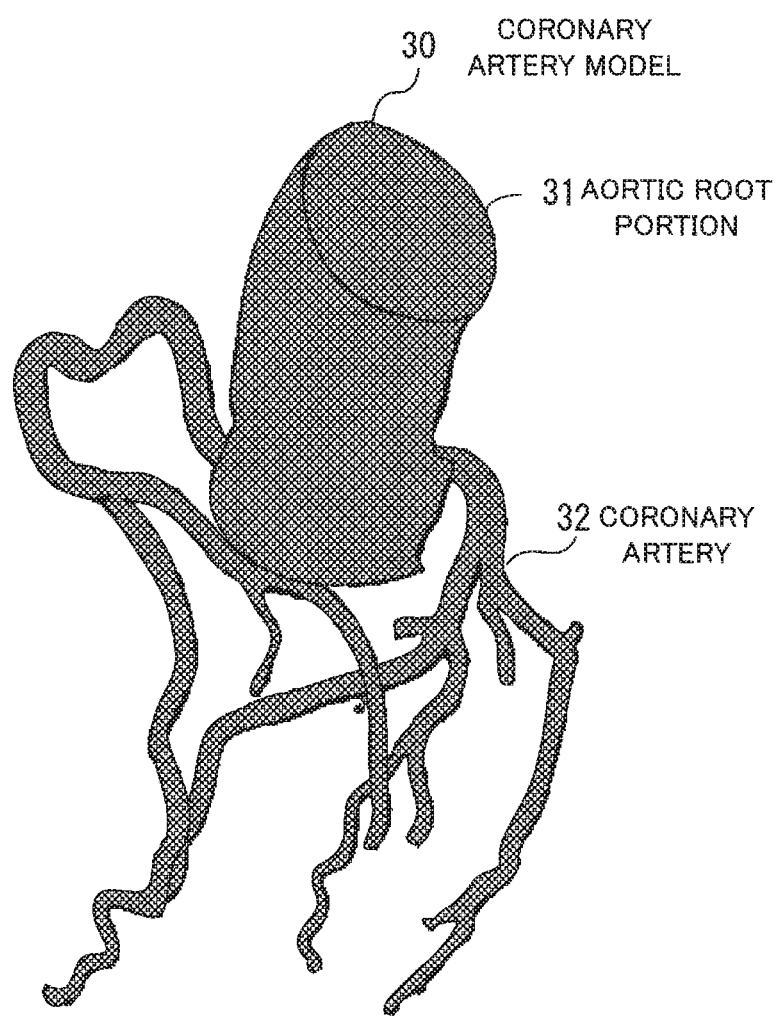
FIG. 5 illustrates an example of a coronary artery model.

FIG. 5 illustrates an example of a coronary artery model. The coronary artery model 30 is a three-dimensional mesh model that represents the shape of an aortic root portion 31 (aorta surrounding an aortic valve) and a coronary artery 32. The coronary artery model 30 is represented by a collection of many tetrahedral elements.

Figure 6:
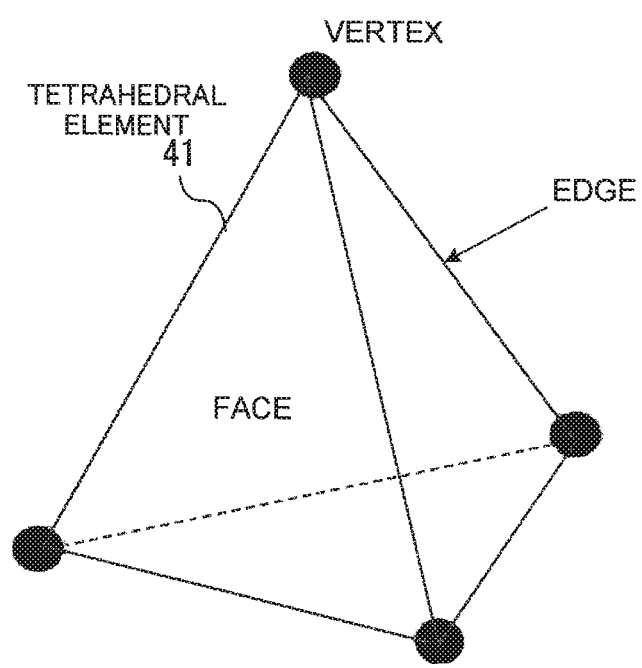
FIG. 6 illustrates an example of a tetrahedral element.

FIG. 6 illustrates an example of a tetrahedral element. The tetrahedral element 41 is formed by four triangular meshes and has four vertices, six edges, and four faces. The tetrahedral element 41 may be called an object. The vertices may be called nodes.

FIG. 7 illustrates an example of a data structure of a three-dimensional mesh model. The three-dimensional mesh model 111 has vertex information 111a, edge information 111b, face information 111c, and object information 111d.

The vertex information 111a is provided for each vertex (node) in the three-dimensional mesh model 111 and is given an identifier (vID) of the vertex. The vertex information 111a on a vertex includes the coordinates (x, y, z) of the vertex, identifiers (edgeID) of edges that share the vertex, a OEM coefficient (K) to be used for edge contraction, and a weight of the node.

The edge information 111b is provided for each edge in the three-dimensional mesh model 111 and is given an identifier (edgeID) of the edge. The edge information 111b on an edge includes the identifier (prev_vID) of a vertex that is a start point of the edge, the identifier (next_vID) of a vertex that is an end point of the edge, and the identifiers (faceID) of faces that share the edge.

The face information 111c is provided for each face in the three-dimensional mesh model 111 and is given an identifier (faceID) of the face. The face information 111c on a face includes the identifiers (vID1, vID2, vID3) of vertices forming the triangular face.

The object information 111d is provided for each object (tetrahedral element) in the three-dimensional mesh model 111 and is given an identifier (objectID) of the object. The object information 111d on an object includes a collection (vID1, vID2, . . . ) of vertices forming the object, a collection (edgeID1, edgeID2, . . . ) of edges forming the object, and a collection (faceID1, faceID2, . . . ) of faces forming the object.

The three-dimensional mesh model 111 is defined by the above data structure. Triangular faces of objects in the three-dimensional mesh model 111 are meshes, and meshes are combined to each other to form one surface. Each triangular mesh is represented by three vertices and three edges connecting the vertices.

The mesh reduction unit 130 moves two adjacent nodes to the same location to merge them into one node, thereby reducing the number of meshes. More specifically, the mesh reduction unit 130 removes one edge between the nodes to be merged and combine the both end nodes of the edge to generate a new node.

With the data structure of FIG. 7, it is possible to obtain, from the vertex information 111a of each node, the identifiers of edges and meshes to which the node belongs. However, if the three-dimensional mesh model 111 has too many meshes, the data amount of the three-dimensional mesh model 111 is large, which causes a difficulty in carrying out a simulation at a high speed. To deal with this, the number of meshes is reduced. The modeling apparatus 100 of the second embodiment is designed to reduce the number of meshes by collapsing edges.

Figure 8:
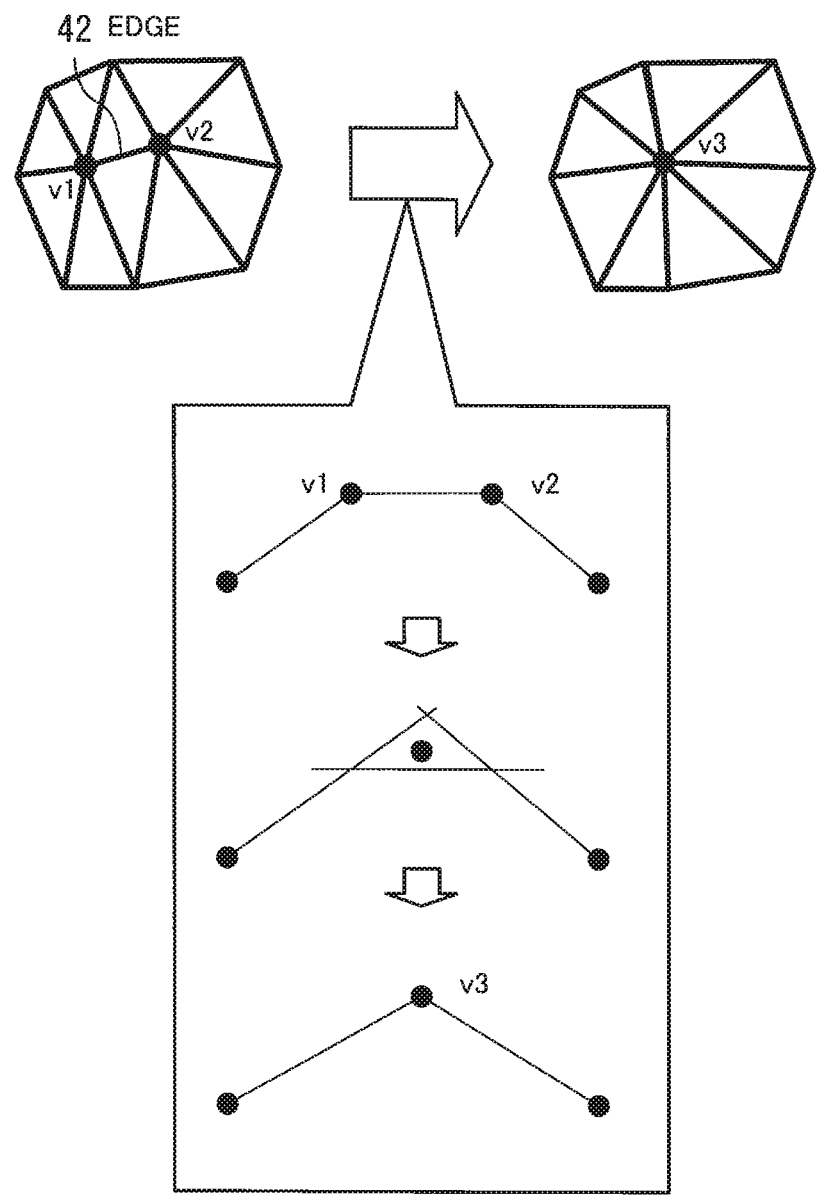
FIG. 8 illustrates an example of reducing the number of meshes by edge collapse.

FIG. 8 illustrates an example of reducing the number of o10 meshes by edge collapse. For example, an edge 42 is collapsed by merging a node v1 and a node v2. In this case, the nodes v1 and v2 are removed and a new node v3 is generated. The edge connecting the nodes v1 and v2 is removed and new edges connecting to the newly generated node v3 are generated. By doing so, two meshes that share the edge 42 are removed.

In reducing the number of meshes by such edge collapse, a method of determining coordinates for the newly generated node v3 takes an important role. For example, consider the case where the coordinates of a middle point between two nodes connected by an edge to be collapsed are set as new coordinates. In this case, as the mesh reduction progresses, the coordinates of a point that more deviate from the original shape are set as new coordinates, which results in losing the original shape. To keep the original shape as much as possible, the mesh reduction unit 130 calculates optimal coordinates taking the original shape into consideration. In the following, the meshes included in the original three-dimensional mesh model 111 are called original meshes.

To calculate optimal coordinates for a new node taking the original shape into consideration, a technique of minimizing, with respect to each node, the sum of squared distances (i.e., QEM) to faces including nodes merged into the node is employed. QEM is calculated in the following manner.

Assume that the plane of a certain mesh is defined as ax+by+cz+d=0. Here, a, b, and c are real numbers, and $a^2+b^2+c^2=1$ is satisfied. In this case, a distance between the coordinates (x, y, z) and the plane is defined by |ax+by+cz+d|.

Therefore, taking $v=[v_x\ v_y\ V_z\ 1]^T$ and $p=[a\ b\ c\ d]^T$, the QEM of a node v is calculated as follows:

$$QEM(v) = \sum_{f \in planes(v)} w_f (p_f^T v)^2 = \qquad (1)$$
$$\sum_{f \in planes(v)} w_f (v^T p_f)(p_f^T v) = \sum_{f \in planes(v)} v^T K_f v = v^T \left( \sum_{f \in planes(v)} K_f \right) v$$

Here, $w_f$ denotes a weight for a mesh f based on the size or the like of the mesh f. $K_f$ is a matrix represented as follows:

$$K_f = pp^T = \begin{bmatrix} a^2 & ab & ac & ad \\ ab & b^2 & bc & bd \\ ac & bc & c^2 & cd \\ ad & bd & cd & d^2 \end{bmatrix} \qquad (2)$$

Here, the QEM of a node v existing from before mesh reduction is calculated by the sum of squared distances between each plane of meshes holding the node v and the node v. Therefore, the QEMs of all nodes v existing from before the mesh reduction are calculated to be zero. The QEM of a node to be generated by collapsing an edge is calculated by the sum of QEMs for the planes of original meshes each holding any one of two nodes at both ends of the edge to be collapsed and nodes merged into the nodes.

Figure 9:
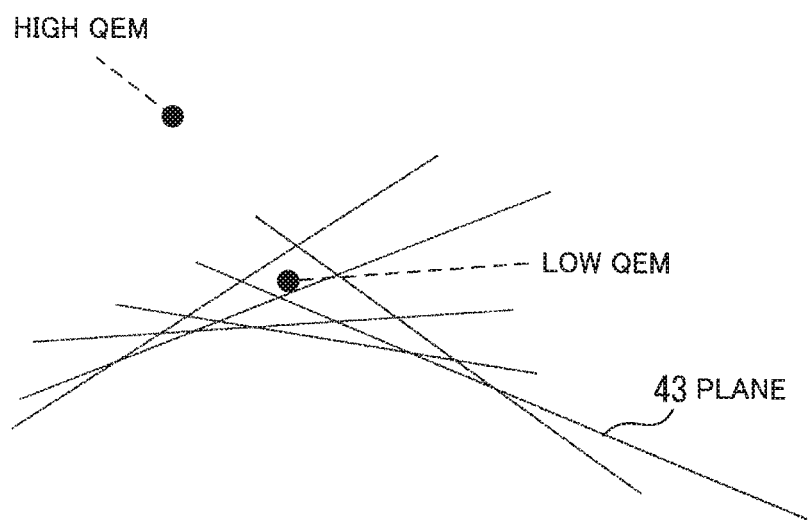
FIG. 9 illustrates relationship between a QEM value of a node and planes.

FIG. 9 illustrates relationship between a QEM value of a node and planes. FIG. 9 illustrates a plurality of planes 43 of original meshes each holding any one of two nodes at both ends of an edge to be collapsed and nodes merged into the nodes. Also, FIG. 9 illustrates points as two possible coordinates for a new node to be generated by collapsing the edge. A point farther from the plurality of planes 43 has a higher QEM value, and a point closer to the plurality of planes 43 has a lower QEM value.

Therefore, the mesh reduction unit 130 takes coordinates that minimize the QEM value, as the coordinates of the new node. That is, coordinates that minimize the distances to meshes each holding any one of two nodes at both ends of an edge to be collapsed and nodes merged into the nodes are determined as the coordinates of the new node.

The coordinates that minimize the QEM are calculated by obtaining a node v that satisfies $K_v=0$, and this is expressed as follows:

$$Kv = \begin{bmatrix} a^2 & ab & ac & ad \\ ab & b^2 & bc & bd \\ ac & bc & c^2 & cd \\ ad & bd & cd & d^2 \end{bmatrix} \begin{bmatrix} v_x \\ v_y \\ v_z \\ 1 \end{bmatrix} = 0 \qquad (3)$$

The above calculation is repeated each time a new node is to be generated. Thereby, the new node is placed at coordinates that minimize distances to all original meshes related to the generated new node, which makes it possible to keep the shape with accuracy. By storing only the coefficient K ($\Sigma K_f$ in the equation 1) represented by a 4-by-4 matrix of the above equation (1), it becomes possible to calculate the sum of squared distances to each mesh. Therefore, the mesh reduction is achieved by storage of a very little amount of information and simple calculations.

By calculating the coordinates of a node to be newly generated using QEM in the way described above, it is possible to satisfy the first requirement of "to keep the original shape as much as possible." In this connection, if only the first requirement needs to be satisfied, edges are collapsed in ascending order of QEM of nodes to be newly generated. In this case, a long narrow mesh is likely to be generated for a long thin shape like a coronary artery. That is to say, the second requirement, "to generate triangular meshes that are as close to equilateral triangles as possible," is not satisfied. In addition, if only edges with respect to which new nodes to be generated have low QEM values are collapsed, meshes have different sizes according to curvatures. As a result, the third requirement, "to determine appropriate sizes of meshes according to the thicknesses of blood vessels," is not satisfied.

To deal with these, the mesh reduction unit 130 gives an evaluation value to each edge and collapses edges in ascending order of their evaluation value. In this connection, a lower evaluation value is given to a shorter edge. This approach makes it possible to prevent triangular meshes from being too long and narrow after edge collapse. In addition, in calculating an evaluation value of an edge, the mesh reduction unit 130 multiplies the length of the edge by a weight based on the thickness of a blood vessel to which the edge belongs, so as to set an appropriate mesh size according to the thickness of the blood vessel.

To satisfy the first to third requirements, the mesh reduction unit 130 provides each node with a 4-by-4 matrix for storing a QEM coefficient K and an area for storing a double-type weight node_weight, as a preparation for the reduction. Then, the mesh reduction unit 130 obtains the initial coefficient K and weight node_weight. The weight node_weight of a node is determined based on the thickness of a blood vessel and the type of the blood vessel determined from the thickness. In the second embodiment, it is assumed that aorta is represented by meshes that are three times as large as those for coronary artery. In this case, the mesh reduction unit 130 sets a weight $w_f$ for meshes belonging to the coronary artery to 3.0 and a weight $w_f$ for meshes belonging to the aorta to 1.0. Then, as the weight node_weight of a node, the mesh reduction unit 130 stores the average of $w_f$ values of all meshes sharing the node.

The mesh reduction unit 130 calculates an evaluation value to be used for determining the order of collapse of edges, using the weights node_weight of nodes. For example, the mesh reduction unit 130 multiplies the length (edge_length) of an edge by the average of weights node_weight of the both end nodes of the edge and takes the multiplication result (edge_length×weight) as the evaluation value of the edge.

Figure 10:
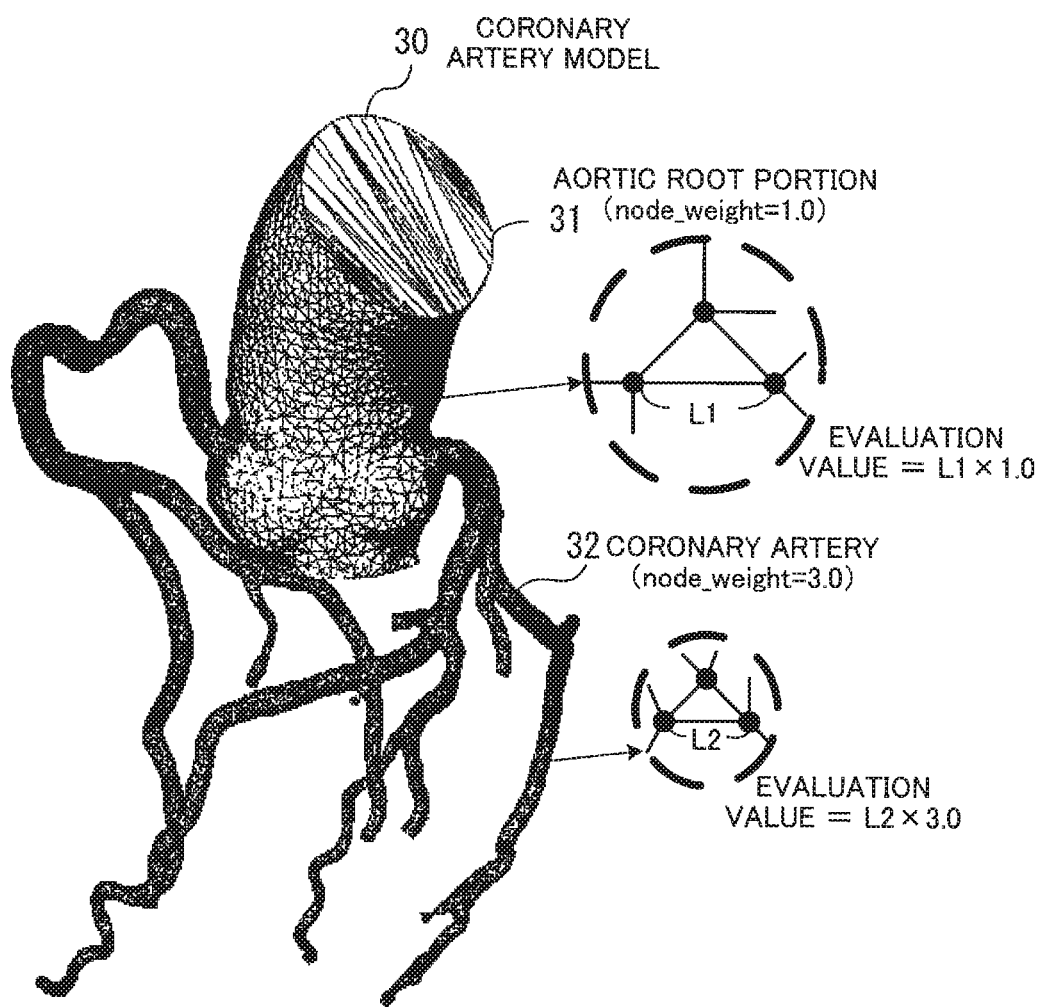
FIG. 10 illustrates an example of weighting according to the thickness of a blood vessel.

FIG. 10 illustrates an example of weighting according to the thickness of a blood vessel. A weight for nodes representing the shape of the aortic root portion 31 is 1.0, and a weight for nodes representing the shape of the coronary artery 32 is 3.0. In the case where an edge in the aortic root portion 31 is L1 (L1 is a positive real number) in length, the evaluation value of the edge is calculated as "L1×1.0." In the case where an edge in the coronary artery 32 is L2 (L2 is a positive real number) in length, the evaluation value of the edge is calculated as "L2×3.0."

If the edge in the aortic root portion 31 and the edge in the coronary artery 32 are the same in length, the edge in the coronary artery 32 has a higher evaluation value. In this case, by preferentially collapsing edges with low evaluation values, it is possible to preferentially collapse the aortic edges.

The mesh reduction unit 130 uses a queue to efficiently select edges with low evaluation values.

Figure 11:
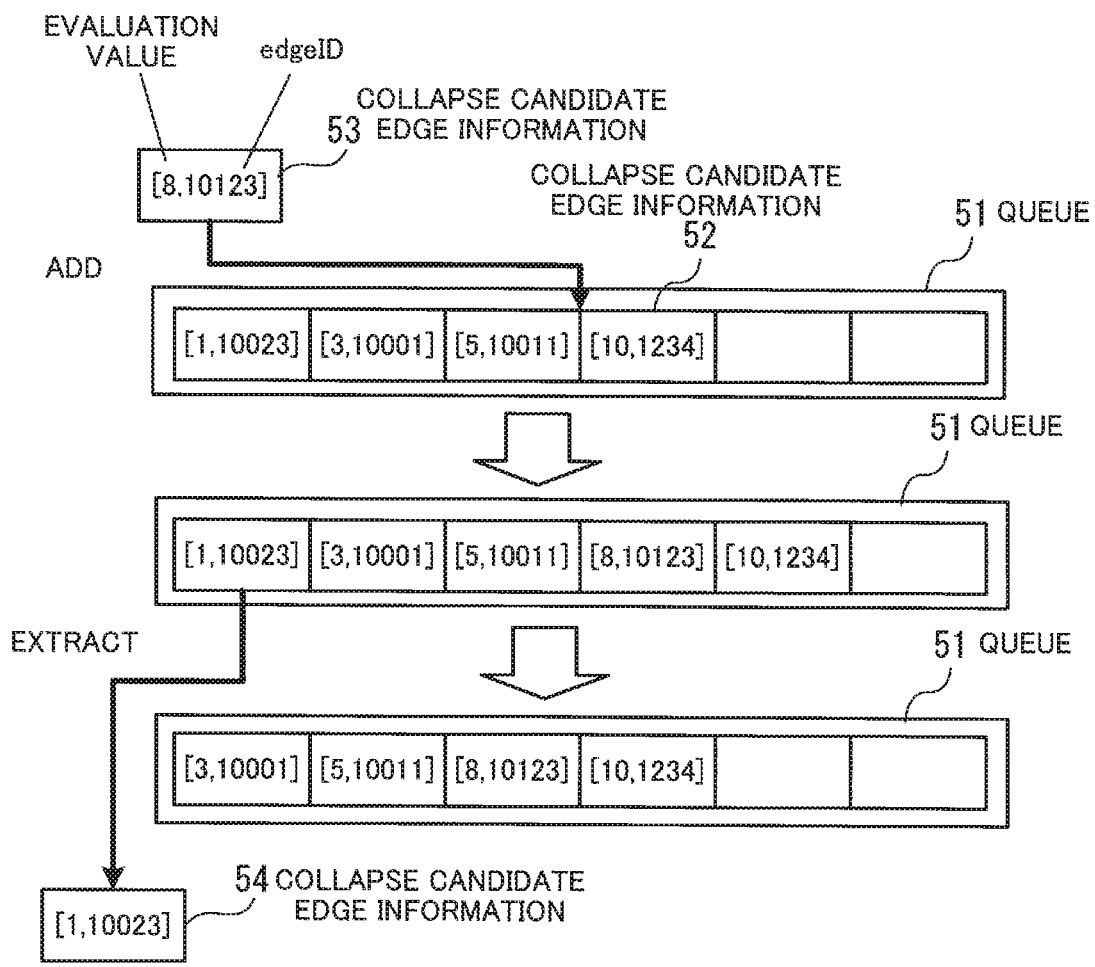
FIG. 11 illustrates an example of a queue for edge contraction.

FIG. 11 illustrates an example of a queue for edge contraction. In an edge contraction queue 51, collapse candidate edge information 52 of each edge, including the evaluation value and identifier (edgeID) of the edge, is registered. The collapse candidate edge information 52 in the queue 51 is sorted in ascending order of evaluation value.

When adding new collapse candidate edge information 53 to the queue 51, the mesh reduction unit 130 compares the already registered collapse candidate edge information 52 with the collapse candidate edge information 53 to be added in terms of evaluation value. Then, the mesh reduction unit 130 inserts the collapse candidate edge information 53 between the collapse candidate edge information 52 that has a lower evaluation value than the collapse candidate edge information 53 to be added and the collapse candidate edge information 52 that has a higher evaluation value than the collapse candidate edge information 53 to be added. In addition, when taking one piece of collapse candidate edge information out of the queue 51, the mesh reduction unit 130 extracts the collapse candidate edge information 54 (with the lowest evaluation value) at the head of the queue 51.

As described above, the use of the queue 51 makes it possible to preferentially extract edges in ascending order of their evaluation value. The mesh reduction unit 130 collapses an extracted edge if the QEM of a new node to be generated by the collapse of the extracted edge is still below a threshold.

By doing so, edges are collapsed in ascending order of their length, and the second requirement of "to generate triangular meshes that are as close to equilateral triangles as possible" is satisfied. That is, when the number of meshes is reduced by collapsing edges, the lengths of surrounding edges become long. If long edges are collapsed with short edges remaining, surrounding meshes existing after the edge collapse become long and narrow. By contrast, by preferentially collapsing short edges, surrounding meshes existing after the edge collapse are expected to be close to equilateral triangles.

In addition, a weight to be used in calculation of an evaluation value of an edge is determined according to the thickness of a blood vessel to which a mesh including the edge belongs. That is, the thinner a blood vessel, the higher the weight. Then, the higher the weight, the higher the evaluation value of the edge. This is because the evaluation value is calculated using the weight. If the edge has a higher evaluation value, the edge will be extracted as a collapse candidate at a later time point and thus has a lower possibility of being collapsed. Thus, the third requirement of "to determine appropriate sizes of meshes according to the thicknesses of blood vessels" is satisfied.

Edge contraction is performed by removing the edge to be collapsed and all edges adjacent to the edge and then generating one new node and edges connecting to the node. Therefore, there is a possibility that collapse candidate edge information about an edge that no more exists remains in the queue 51. It is not possible to perform the edge contraction process on such already removed edges. Therefore, when extracting collapse candidate edge information from the queue 51, the mesh reduction unit 130 determines whether collapse of a corresponding edge is possible. If the collapse of the edge corresponding to the collapse candidate edge information extracted from the queue 51 is not determined possible, the mesh reduction unit 130 extracts new collapse candidate edge information from the queue 51.

In addition, a higher QEM value indicates a greater deviation from the original shape of the coronary artery model. Therefore, the mesh reduction unit 130 uses a threshold to determine whether to collapse an edge. For example, when collapsing one edge, the mesh reduction unit 130 stores a QEM coefficient K and a weight node_weight in the node information of a newly generated node. The coefficient K and weight node_weight are the weighted averages of the corresponding values of two merged nodes. After that, the mesh reduction unit 130 generates a plurality of edges connecting to the new node and registers them in the queue. The evaluation value of an edge to be registered in the queue is calculated by multiplying the length of the edge by the weighted average of the weights node_weight of two nodes connected by the edge.

The following describes the mesh reduction process in detail.

Figure 12:
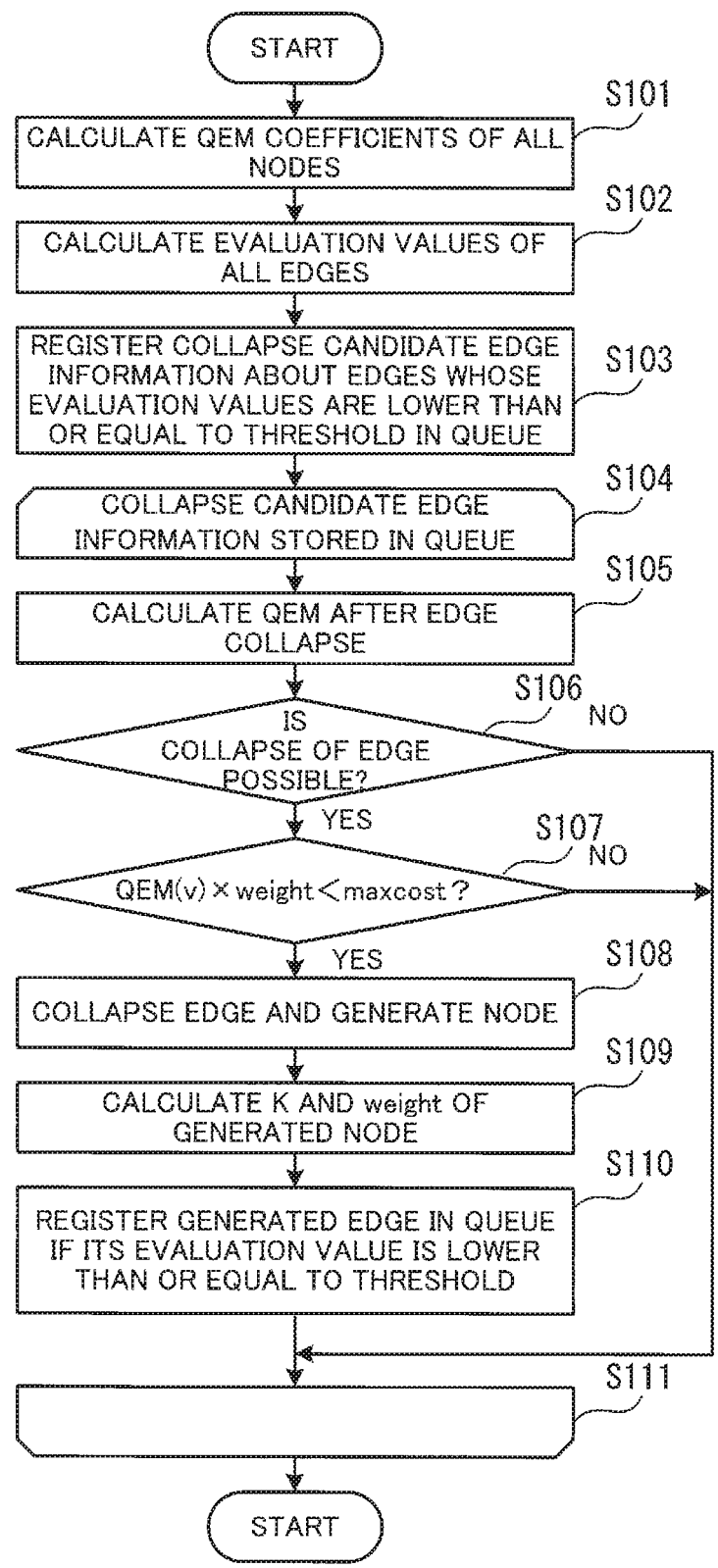
FIG. 12 is a flowchart illustrating an example of a mesh reduction process.

FIG. 12 is a flowchart illustrating an example of the mesh reduction process. The following describes the process of FIG. 12 step by step.

(Step S101) The mesh reduction unit 130 calculates QEM coefficients K ($\Sigma K_f$ in equation (1)) with respect to all nodes. The mesh reduction unit 130 calculates the coefficient K of each node and sets it in the vertex information 111a (see FIG. 7) of the node.

(Step S102) The mesh reduction unit 130 calculates evaluation values with respect to all edges. For example, the mesh reduction unit 130 multiplies the length of an edge by the average of weights node_weight of two nodes connected by the edge, and takes the multiplication result as the evaluation value of the edge.

(Step S103) The mesh reduction unit 130 registers the collapse candidate edge information corresponding to edges whose evaluation values are lower than or equal to an evaluation value threshold, in the queue. Each collapse candidate edge information includes the evaluation value and identifier (edgeID) of a corresponding edge. The mesh reduction unit 130 registers the collapse candidate edge information in the queue in ascending order of evaluation value.

(Step S104) The mesh reduction unit 130 extracts the collapse candidate edge information one by one in order from the one placed at the head of the queue, and performs the edge contraction process of steps S105 to S110. In these steps S105 to S110, whether collapse of an edge indicated in the collapse candidate edge information is possible is determined and, if the collapse of the edge is determined possible, the edge is subjected to a collapse process.

(Step S105) The mesh reduction unit 130 takes the edge corresponding to the extracted collapse candidate edge information as a collapse candidate, and calculates the QEM of a node to be generated by the collapse of the edge.

(Step S106) The mesh reduction unit 130 determines whether the collapse of the collapse candidate edge is possible. For example, there may be a case where the collapse candidate edge has been removed according to collapse of an edge adjacent to the collapse candidate edge. In this case, the collapse candidate edge is already removed and so its collapse is not possible. If the collapse of the collapse candidate edge is possible, the process proceeds to step S107. Otherwise, the process proceeds to step S111.

(Step S107) The mesh reduction unit 130 determines whether the value calculated by multiplying the QEM of the node to be generated by the collapse of the collapse candidate edge by a corresponding weight is lower than a QEM threshold (maxcost). For example, the mesh reduction unit 130 obtains the coefficients K from the node information of both end nodes of the collapse candidate edge. Then, the mesh reduction unit 130 takes the sum of the coefficients K of the nodes as the coefficient K of the new node to be generated. Further, the mesh reduction unit 130 calculates the coordinates of the node v that minimize the QEM of the new node, with the equation (3). The mesh reduction unit 130 calculates the QEM of the new node to be generated with the equation (1) using the coordinates of the node v that minimize the QEM.

Then, the mesh reduction unit 130 multiplies the calculated QEM by the weight and compares the multiplication result with the QEM threshold. The weight for the new node to be generated is the average of weights of both end nodes of the collapse candidate edge, for example.

If the result of multiplying the QEM by the weight is lower than the QEM threshold, the process proceeds to step S108. Otherwise, the process proceeds to step S111.

(Step S108) The mesh reduction unit 130 collapses the collapse candidate edge and generates a new node. For example, the mesh reduction unit 130 removes the collapse candidate edge and other elements (edges, nodes, meshes, objects) to be removed according to the collapse of the collapse candidate edge. The mesh reduction unit 130 then generates the new node into which the both end nodes of the collapse candidate edge are merged, at a position that minimizes the QEM. Then, the mesh reduction unit 130 generates edges connecting to the new node, meshes having the generated edges, and objects having the generated meshes.

(Step S109) The mesh reduction unit 130 calculates a coefficient K and weight of the generated node.

(Step S110) The mesh reduction unit 130 calculates an evaluation value of each generated edge. Then the mesh reduction unit 130 registers collapse candidate edge information corresponding to an edge in the queue if the calculated evaluation value of the edge is lower than or equal to the evaluation value threshold.

(Step S111) The mesh reduction unit 130 repeats steps S105 to S110 if the queue includes a collapse candidate edge that is not yet processed. If the queue does not include any unprocessed collapse candidate edge, the mesh reduction unit 130 completes the mesh reduction process.

As described above, mesh reduction that satisfies the above first to third requirements is achieved. Satisfaction of the first to third requirements keeps the shape of the coronary artery model closer to its original shape even after the number of meshes is reduced.

Figure 13:
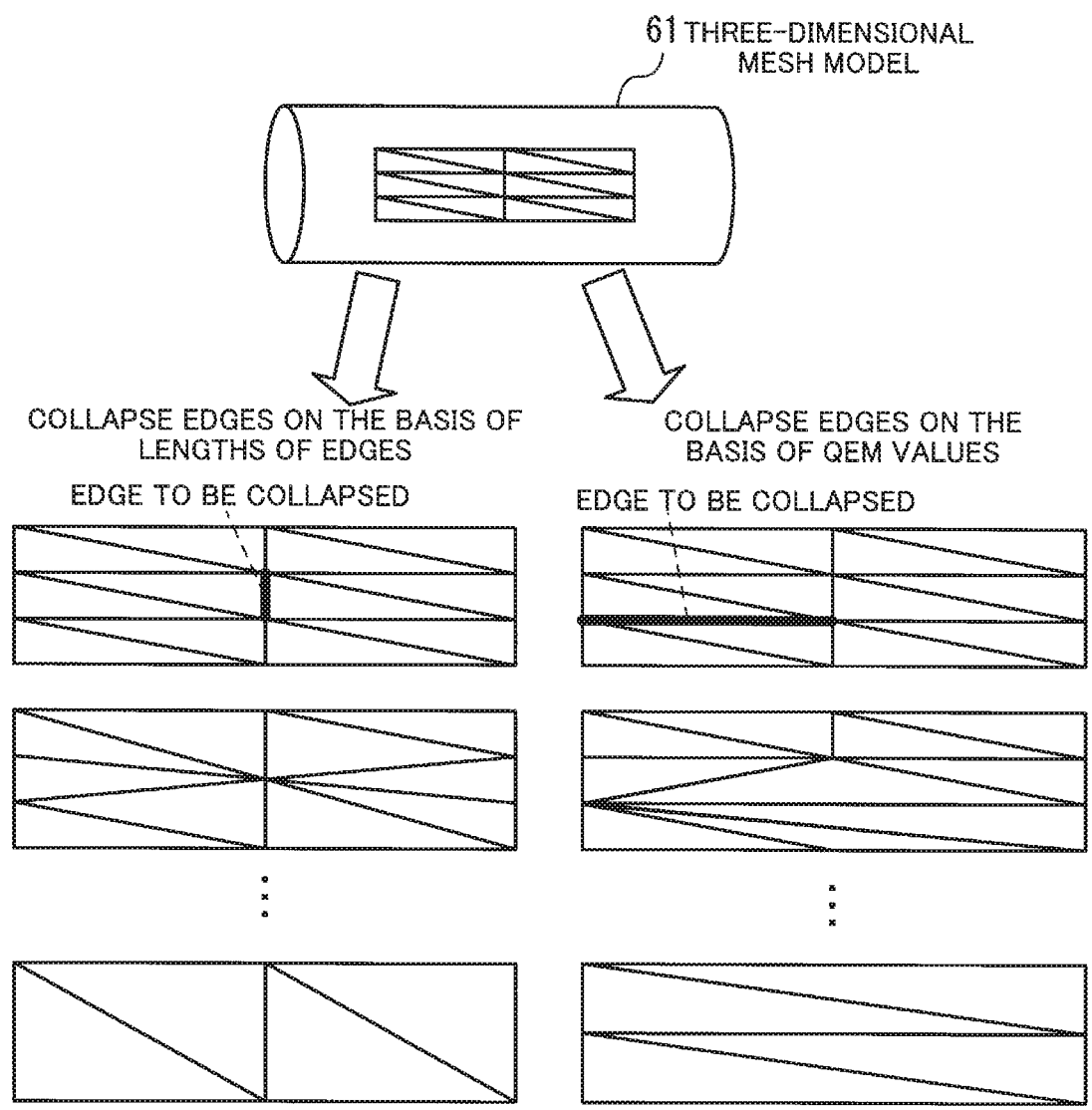
FIG. 13 illustrates examples of reducing the number of meshes in a long thin model.

FIG. 13 illustrates examples of reducing the number of meshes in a long thin model. FIG. 13 illustrates examples of performing a mesh reduction process on a cylindrical three-dimensional mesh model 61, on the basis of the lengths of edges (second embodiment) and on the basis of QEM values (comparative example). In this connection, in either mesh reduction process, a node to be generated by collapse of an edge is placed at a position that minimizes QEM.

In the case of collapsing edges on the basis of QEM values, edges are collapsed in ascending order of QEM of new nodes to be generated by edge collapse. At this time, the shapes of meshes after the edge collapse are not taken into account. By repeating the collapse of an edge, long narrow triangular meshes are generated as illustrated in FIG. 13. By contrast, by collapsing edges in order from the shortest edge, on the basis of the lengths of edges, the meshes generated by the edge collapse are shaped close to equilateral triangles.

If meshes have a shape that greatly deviates from an equilateral triangle, it is difficult to keep the original shape along with a continuous reduction in the number of meshes.

Figure 14:
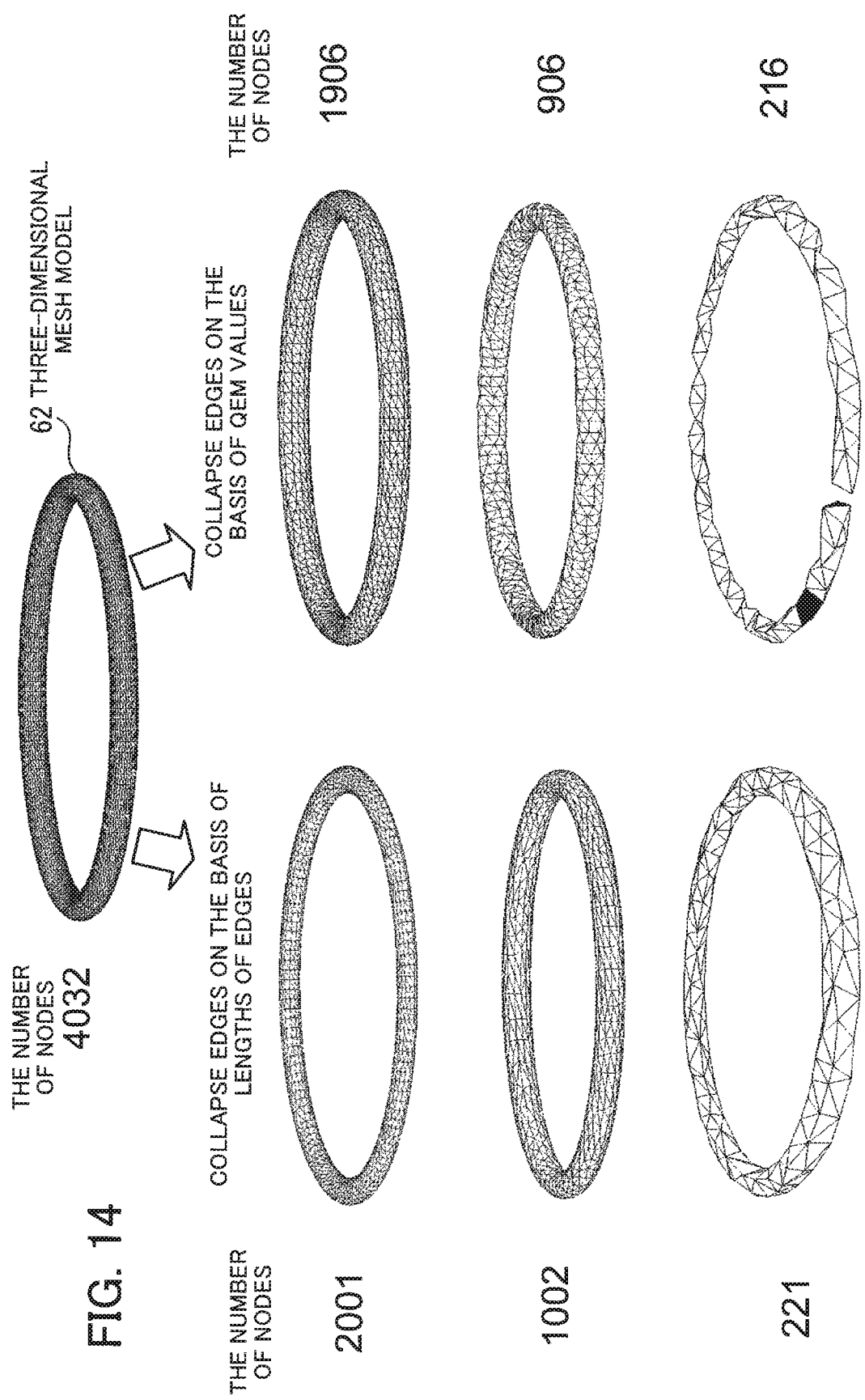
FIG. 14 illustrates examples of changes in a model shape at the time of mesh reduction.

FIG. 14 illustrates examples of changes in a model shape at the time of mesh reduction. FIG. 14 illustrates examples of performing a mesh reduction process on a donut-shaped three-dimensional mesh model 62, on the basis of the lengths of edges (second embodiment) and on the basis of QEM values (comparative example). In either mesh reduction process, a node to be generated by collapse of an edge is placed at a position that minimizes QEM.

The original three-dimensional mesh model 62 has 4032 nodes. To perform the mesh reduction process on the three-dimensional mesh model 62 gradually reduces the number of nodes and changes the shape of the model. In the case of collapsing edges in ascending order of QEM value of nodes to be generated by edge collapse (right part of FIG. 14), the mesh model fails to keep its donut shape along with the reduction in the number of nodes. By contrast, in the case of collapsing edges in ascending order of their length (left part of FIG. 14), the mesh model keeps its donut shape even after the number of nodes is reduced.

In the second embodiment, weighting is performed according to the thicknesses of blood vessels so that the mesh reduction does not increase the size of meshes forming thin portions too much. As a result, it is possible to reduce the number of meshes without greatly losing the original shape of the three-dimensional mesh model in which thick portions and thin portions coexist.

FIG. 15 illustrates an example of mesh reduction in a three-dimensional mesh model having portions of different thicknesses. FIG. 15 illustrates an original coronary artery model 63 (before mesh reduction) and a coronary artery model 64 (after mesh reduction). The coronary artery model 63 includes a thick aortic root portion and a thin coronary artery. After the mesh reduction, the aorta and the coronary artery are represented by meshes of different sizes, and the boundary portion therebetween does not have narrow and pointed meshes due to a sudden change in mesh size but has made a favorable change.

As described above, the second embodiment is designed to collapse edges in ascending order of their length and generate new nodes at positions that minimize QEMs, so that it is possible to generate triangular meshes that are as close to equilateral triangles as possible while keeping the original shape. Particularly, this approach makes it possible that a three-dimensional mesh model that is long and thin like a blood vessel keeps its original shape even when the number of meshes is greatly reduced.

In addition, by setting a weight according to the thickness of a blood vessel, it becomes possible to greatly reduce the number of meshes representing thick blood vessels and to use fine meshes to represent thin blood vessels, thereby keeping an appropriate shape.

By using a three-dimensional mesh model with reduced meshes, it is possible to carry out an efficient heart simulation because of the reduction in the number of meshes. In addition, since there is only a little deviation from the original shape, the simulation is carried out with accuracy. Further, the shapes of meshes are close to equilateral triangles, and so an unnatural shape is avoided even when the coronary artery model deforms during the course of the simulation, thereby improving the accuracy of the simulation.

Other Embodiments

The second embodiment is designed to use the length of an edge in calculation of an evaluation value. Alternatively, another index may be usable for calculating the evaluation value. For example, an aspect ratio of a mesh may be used for this purpose. The aspect ratio is a radius ratio of an inner circle to an outer circle of a triangle representing a mesh, for example. The radius of the inner circle of the mesh is divided by the radius of the outer circle of the mesh, and a result of multiplying the division result by a prescribed constant value may be used as the aspect ratio. The constant value used in the multiplication is determined such that the aspect ratio of the mesh becomes one when the mesh is an equilateral triangle.

In the case of using such an aspect ratio in calculation of an evaluation value, the mesh reduction unit 130 selects meshes in descending order of their aspect ratio and collapses the shortest edge included in the selected mesh.

According to one aspect, it is possible to prevent great deviation from the original shape when the number of meshes is reduced.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A modeling apparatus comprising:
 a memory configured to store therein a three-dimensional mesh model representing a three-dimensional shape with a plurality of nodes, a plurality of edges each connecting two nodes among the plurality of nodes, and a plurality of faces each with three or more nodes among the plurality of nodes as vertices; and
 a processor configured to perform a process including
  calculating, based on a length of each of the plurality of edges, an evaluation value of said each edge in such a way that the evaluation value is decreased with a decrease in the length,
  selecting the plurality of edges one by one as a first edge in ascending order of evaluation value, and
  removing, upon detecting a specific node placement position where a value of a calculation formula using distances between the specific node placement position and first faces each including at least either one of first nodes at both ends of the selected first edge as a vertex is lower than or equal to a threshold, the first edge, the first nodes, and the first faces from the three-dimensional mesh model, and adding a second node at the specific node placement position, second edges each including the second node at one end thereof, and second faces each including the second node as a vertex to the three-dimensional mesh model.

2. The modeling apparatus according to claim 1, wherein:
the process further includes calculating an evaluation value of each of the second edges, based on a length of said each second edge after adding said each second edge; and
the selecting includes selecting the second edges and edges that are not yet selected among the plurality of edges, as the first edge in ascending order of evaluation value.

3. The modeling apparatus according to claim 1, wherein, in calculating an evaluation value of a target edge included in a cylindrical portion of the three-dimensional mesh model among the plurality of edges, the calculating includes multiplying a length of the target edge by a first weight and taking a result of the multiplying as the evaluation value of the target edge, the first weight being set based on a radius of the cylindrical portion.

4. The modeling apparatus according to claim 3, wherein the calculating further includes taking, as the first weight, an average of weights respectively set based on radii of cylindrical portions to which nodes at both ends of the target edge belong.

5. The modeling apparatus according to claim 1, wherein, in response to selecting an edge included in a cylindrical portion of the three-dimensional mesh model among the plurality of edges as the first edge, the removing and the adding include using, as the calculation formula, a formula of multiplying a value calculated based on the distances between the specific node placement position and the first faces by a second weight set based on a radius of the cylindrical portion.

6. The modeling apparatus according to claim 5, wherein the removing and the adding further include taking, as the second weight, an average of weights respectively set based on radii of cylindrical portions to which the first nodes at the both ends of the first edge belong.

7. A modeling method comprising;
referring, by a processor, to a three-dimensional mesh model representing a three-dimensional shape with a plurality of nodes, a plurality of edges each connecting two nodes among the plurality of nodes, and a plurality of faces each with three or more nodes among the plurality of nodes as vertices, and calculating, based on a length of each of the plurality of edges; an evaluation value of said each edge in such a way that the evaluation value is decreased with a decrease in the length;
selecting, by the processor, the plurality of edges one by one as a first edge in ascending order of evaluation value; and
removing, by the processor, upon detecting a specific node placement position where a value of a calculation formula using distances between the specific node placement position and first faces each including at least either one of first nodes at both ends of the selected first edge as a vertex is lower than or equal to a threshold; the first edge, the first nodes, and the first faces from the three-dimensional mesh model; and adding a second node at the specific node placement position; second edges each including the second node at one end thereof, and second faces each including the second node as a vertex to the three-dimensional mesh model.

8. A non-transitory computer-readable recording medium that causes a computer to perform a process comprising:
referring to a three-dimensional mesh model representing a three-dimensional shape with a plurality of nodes, a plurality of edges each connecting two nodes among the plurality of nodes, and a plurality of faces each with three or more nodes among the plurality of nodes as vertices, and calculating, based on a length of each of the plurality of edges, an evaluation value of said each edge in such a way that the evaluation value is decreased with a decrease in the length;
selecting the plurality of edges one by one as a first edge in ascending order of evaluation value; and
removing, upon detecting a specific node placement position where a value of a calculation formula using distances between the specific node placement position and first faces each including at least either one of first nodes at both ends of the selected first edge as a vertex is lower than or equal to a threshold, the first edge, the first nodes, and the first faces from the three-dimensional mesh model, and adding a second node at the specific node placement position, second edges each including the second node at one end thereof, and second faces each including the second node as a vertex to the three-dimensional mesh model.

* * * * *